(12) United States Patent
Oliver et al.

(10) Patent No.: US 8,963,292 B2
(45) Date of Patent: Feb. 24, 2015

(54) SEMICONDUCTOR DEVICE HAVING BACKSIDE REDISTRIBUTION LAYERS AND METHOD FOR FABRICATING THE SAME

(71) Applicant: Micron Technology, Inc., Boise, ID (US)

(72) Inventors: Steve Oliver, Boise, ID (US); Warren Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/789,305

(22) Filed: Mar. 7, 2013

(65) Prior Publication Data

US 2013/0181348 A1 Jul. 18, 2013

Related U.S. Application Data

(60) Continuation of application No. 13/072,445, filed on Mar. 25, 2011, now Pat. No. 8,395,242, which is a division of application No. 11/881,469, filed on Jul. 27, 2007, now Pat. No. 7,932,179.

(51) Int. Cl.
| | | |
|---|---|---|
| *H01L 21/44* | (2006.01) | |
| *H01L 29/40* | (2006.01) | |
| *H01L 23/485* | (2006.01) | |

(Continued)

(52) U.S. Cl.
CPC ............ *H01L 23/485* (2013.01); *H01L 21/768* (2013.01); *H01L 21/76898* (2013.01); *H01L 21/76877* (2013.01); *H01L 24/11* (2013.01)
USPC ................... 257/621; 257/774; 257/E21.597; 257/E23.011; 438/667

(58) Field of Classification Search
CPC ............ H01L 21/76898; H01L 23/481; H01L 2224/73265; H01L 2225/06513; H01L 2225/06541
USPC .................. 257/774, 621, E21.597, E23.011; 438/667
See application file for complete search history.

(56) References Cited

U.S. PATENT DOCUMENTS

| | | | |
|---|---|---|---|
| 4,906,314 A | 3/1990 | Farnworth et al. | |
| 5,166,097 A | 11/1992 | Tanielian | |
| 5,608,264 A * | 3/1997 | Gaul ............................ | 257/734 |

(Continued)

FOREIGN PATENT DOCUMENTS

| | | |
|---|---|---|
| JP | 2007201689 | 8/1995 |
| JP | 2007242860 | 9/1995 |

(Continued)

OTHER PUBLICATIONS

Garrou, P., "Thin Film Polymeric Materials in Microelectronic Packaging and Interconnect"; Advanced Packaging Materials, 1998 4th International Symposium on Proceedings; Mar. 15-18, 1998; pp. 53-59.

(Continued)

*Primary Examiner* — Steven J Fulk
(74) *Attorney, Agent, or Firm* — Fletcher Yoder, P.C.

(57) ABSTRACT

Present embodiments relate to a semiconductor device having a backside redistribution layer and a method for forming such a layer. Specifically, one embodiment includes providing a substrate comprising a via formed therein. The substrate has a front side and a backside. The embodiment may further include forming a trench on the backside of the substrate, disposing an insulating material in the trench, and forming a trace over the insulating material in the trench.

19 Claims, 12 Drawing Sheets

(51) Int. Cl.
*H01L 21/768* (2006.01)
*H01L 23/00* (2006.01)

(56) References Cited

U.S. PATENT DOCUMENTS

| | | | |
|---|---|---|---|
| 5,652,557 A | 7/1997 | Ishikawa | |
| 5,994,763 A | 11/1999 | Ohmuro | |
| 6,022,797 A | 2/2000 | Ogasawara et al. | |
| 6,184,060 B1* | 2/2001 | Siniaguine | 438/106 |
| 6,286,684 B1 | 9/2001 | Brooks et al. | |
| 6,437,451 B2 | 8/2002 | Farnworth et al. | |
| 6,446,933 B1 | 9/2002 | Westmoreland | |
| 6,555,921 B2 | 4/2003 | Kwon et al. | |
| 6,693,358 B2 | 2/2004 | Yamada et al. | |
| 6,796,641 B2* | 9/2004 | Lebens et al. | 347/77 |
| 6,844,623 B1 | 1/2005 | Peterson et al. | |
| 6,952,054 B2 | 10/2005 | Akram et al. | |
| 7,495,331 B2* | 2/2009 | Ito et al. | 257/698 |
| 2002/0030245 A1* | 3/2002 | Hanaoka et al. | 257/621 |
| 2002/0185584 A1 | 12/2002 | Westmoreland | |
| 2003/0001221 A1* | 1/2003 | Fischer et al. | 257/417 |
| 2003/0082847 A1 | 5/2003 | Turner et al. | |
| 2004/0002573 A1 | 1/2004 | Apen et al. | |
| 2004/0021139 A1* | 2/2004 | Jackson et al. | 257/40 |
| 2004/0056345 A1 | 3/2004 | Gilleo | |
| 2004/0077180 A1 | 4/2004 | Sebald | |
| 2004/0166659 A1 | 8/2004 | Lin et al. | |
| 2004/0212086 A1* | 10/2004 | Dotta et al. | 257/737 |
| 2005/0009329 A1 | 1/2005 | Tanida et al. | |
| 2005/0095750 A1 | 5/2005 | Lo et al. | |
| 2005/0104187 A1* | 5/2005 | Polsky et al. | 257/690 |
| 2005/0214673 A1 | 9/2005 | Clark et al. | |
| 2005/0282378 A1 | 12/2005 | Fukunaga et al. | |
| 2006/0001439 A1 | 1/2006 | Akram et al. | |
| 2006/0006441 A1* | 1/2006 | Park et al. | 257/296 |
| 2006/0009050 A1* | 1/2006 | Hougham et al. | 439/66 |
| 2006/0019420 A1 | 1/2006 | Liao et al. | |
| 2006/0043599 A1 | 3/2006 | Akram et al. | |
| 2006/0046468 A1 | 3/2006 | Akram et al. | |
| 2006/0068580 A1* | 3/2006 | Dotta | 438/612 |
| 2006/0160274 A1 | 7/2006 | Larson | |
| 2006/0183349 A1 | 8/2006 | Farnworth et al. | |
| 2006/0289307 A1 | 12/2006 | Yu et al. | |
| 2006/0292877 A1 | 12/2006 | Lake | |
| 2007/0032059 A1 | 2/2007 | Hedler et al. | |
| 2007/0052080 A1* | 3/2007 | Chen | 257/686 |
| 2007/0073020 A1 | 3/2007 | Watanabe et al. | |
| 2007/0082297 A1 | 4/2007 | Choi et al. | |
| 2007/0284602 A1 | 12/2007 | Chitnis et al. | |
| 2008/0136026 A1* | 6/2008 | Yang | 257/738 |
| 2008/0237849 A1* | 10/2008 | Pratt | 257/737 |
| 2009/0032964 A1 | 2/2009 | Farnworth et al. | |

FOREIGN PATENT DOCUMENTS

| | | |
|---|---|---|
| JP | 2009165558 | 6/1997 |
| JP | 2000003993 | 1/2000 |
| JP | 2003114232 | 4/2003 |
| JP | 2003227046 | 8/2003 |
| JP | 2005150235 | 6/2005 |
| JP | 2007312374 | 11/2007 |
| WO | WO03081653 | 10/2003 |
| WO | WO2006101768 | 9/2006 |
| WO | WO2006128028 | 11/2006 |

OTHER PUBLICATIONS

Liang, Z. et al.; "A Chip-Level Process for Power Switching Module Integration and Packaging"; 39th IAS Annual Meeting Conference Record of the Industry Applications Conference, vol. 3; Oct. 3-7, 2004; pp. 1932-1939.

Strandjord, A.J.G. et al.; "Photosensitive Benzocyclobutene for Stress-Buffer and Passivation Applications (One Mask Manufacturing Process)"; Microelectron. Res. & Dev., The Dow Chemical Co., Electronic Components and Technology Conference, Proceedings, May 18-21, 1997; pp. 1260-1268.

Wall, R.N. et al.; "A New Four-Level Metal Interconnect System Tailored to an Advanced 0.5-pm BICMOS Technology"; IEEE Transactions on Semiconductor Manufacturing, vol. 11, Issue 4, Nov. 1998; pp. 624-635.

Wu et al.; A Through-Wafer Interconnect in Silicon for RFICs; Massachusetts Inst. of Technol., Cambridge, MA, USA; Electron Devices, IEEE Transactions on Publication Date: Nov. 2004; vol. 51, Issue: 11; pp. 1765-1771.

Wu et al.; A High Aspect-Ratio Silicon Substrate-Via Technology and Applications; Through-Wafer Interconnects for Power and Ground and Faraday Cages for SOC Isolation; MIT, Cambridge, MA, USA; Electron Devices Meeting, 2000; IEDM Technical Digest International Publication Date: Dec. 10-13, 2000; pp. 477-480.

De Samber et al.; Through Wafer Interconnection Technologies for Advanced Electronic Devices; Philips Centre for Ind. Technol., Eindhoven, Netherlands; Electronics Packaging Technology Conference, 2004; EPTC 2004; Proceedings of 6$^{th}$ Publication Date: Dec. 8-10, 2004; pp. 1-6.

Polyakov et al.; Comparison of Via-Fabrication Techniques for Through-Wafer Electrical Interconnect Applications; Delft University of Technology, DIMES/ECTM, Delft, The Netherlands; Electronic Components and Technology Conference, 2004. Proceedings. 54$^{th}$ Publication Date: Jun. 1-4, 2004; vol. 2; pp. 1466-1470 vol. 2.

O'Brien, J. et al.; "Advanced Photoresist Technologies for Microsystems"; Micromech. Microeng., vol. 11; pp. 353-358 (2001) (in final form May 22, 2001).

* cited by examiner

FIG. 13

SEMICONDUCTOR DEVICE HAVING BACKSIDE REDISTRIBUTION LAYERS AND METHOD FOR FABRICATING THE SAME

This application is a continuation of pending U.S. patent application Ser. No. 13/072,445, filed Mar. 25, 2011, which is a divisional of U.S. patent application Ser. No. 11/881,469, filed Jul. 27, 2007, now U.S. Pat. No. 7,932,179, each of which is incorporated herein by reference.

BACKGROUND

1. Field of the Invention

Embodiments of the present invention relate generally to the field of semiconductor devices. More particularly, embodiments of the present invention relate to the production of semiconductor devices with a backside redistribution layer.

2. Description of the Related Art

Microprocessor-controlled circuits are used in a wide variety of applications. Such applications include personal computers, cellular phones, digital cameras, control systems, and a host of other consumer products. A personal computer, digital camera, or the like, generally includes various components, such as microprocessors, that handle different functions for the system. By combining these components, various consumer products and systems may be designed to meet specific needs. Microprocessors are essentially generic devices that perform specific functions under the control of software programs. These software programs are generally stored in one or more memory devices that are coupled to the microprocessor and/or other peripherals.

Electronic components such as microprocessors and memory devices often include numerous integrated circuits manufactured on a semiconductor substrate. The various structures or features of these integrated circuits may be fabricated on a substrate through a variety of manufacturing processes known in the art, including layering, doping, and patterning. Obviously, the size of each feature directly impacts the number of features that may be formed on a substrate of a given size. Accordingly, it is generally desirable to reduce the size of such features in order to increase the number of elements that may be formed in a given area of the substrate. Similarly, it is desirable to efficiently utilize available space on the substrate by, for example, utilizing the backside of the substrate.

DETAILED DESCRIPTION OF SPECIFIC EMBODIMENTS

Figure 1:
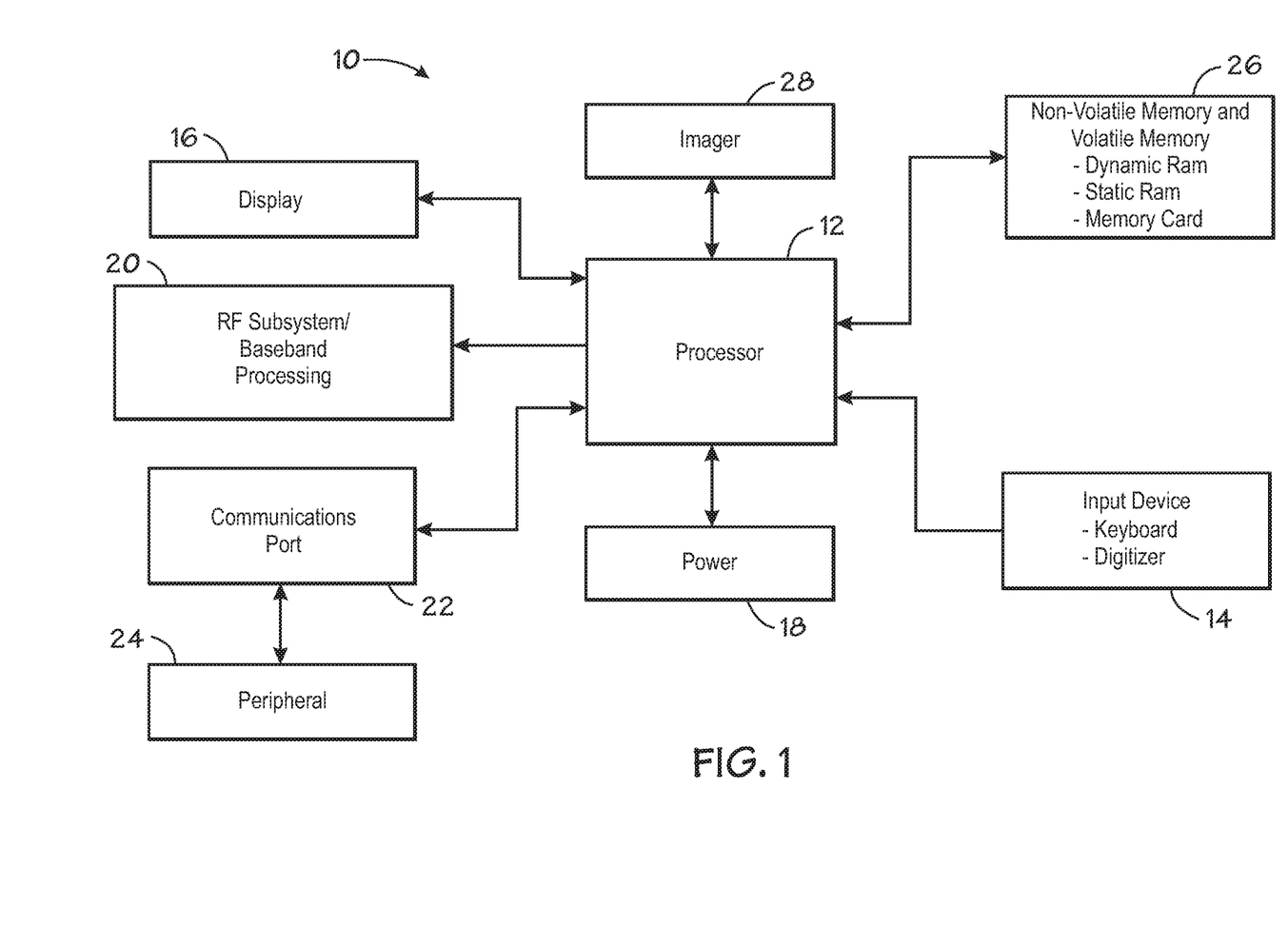
FIG. 1 illustrates a block diagram of a processor-based device in accordance with one embodiment of the present invention.

FIG. 1 is a block diagram of an electronic system containing integrated circuit devices that may employ embodiments of the present invention. The electronic device or system, which is generally indicated by the reference numeral 10, may be any of a variety of types, such as a computer, digital camera, cellular phone, personal organizer, or the like. In a typical processor-based device, a processor 12, such as a microprocessor, controls the operation of system functions and requests.

Various devices may be coupled to the processor 12 depending on the functions that the system 10 performs. For example, an input device 14 may be coupled to the processor 12 to receive input from a user. The input device 14 may comprise a user interface and may include buttons, switches, a keyboard, a light pen, a mouse, a digitizer, a voice recognition system, or any of a number of other input devices. An audio or video display 16 may also be coupled to the processor 12 to provide information to the user. The display 16 may include an LCD display, a CRT display, or LEDs, for example. Further, the system 10 may include a power supply 18, which may comprise a battery or batteries, a battery receptor, an AC power adapter, or a DC power adapter, for instance. The power supply 18 may provide power to one or more components of the system 10.

An RF sub-system/baseband processor 20 may be coupled to the processor 12 to provide wireless communication capability. The RF subsystem/baseband processor 20 may include an antenna that is coupled to an RF receiver and to an RF transmitter (not shown). Furthermore, a communications port 22 may be adapted to provide a communication interface between the electronic system 10 and a peripheral device 24. The peripheral device 24 may include a docking station, expansion bay, or other external component.

The processor 12 may be coupled to various types of memory devices to facilitate its operation. For example, the processor 12 may be connected to memory 26, which may include volatile memory, non-volatile memory, or both. The volatile memory of memory 26 may comprise a variety of memory types, such as static random access memory ("SRAM"), dynamic random access memory ("DRAM"), first, second, or third generation Double Data Rate memory ("DDR1", "DDR2", or "DDR3", respectively), or the like. The non-volatile memory of the memory 26 may comprise various types of memory such as electrically programmable read only memory ("EPROM") or flash memory, for example. Additionally, the non-volatile memory may include a high-capacity memory such as a tape or disk drive memory.

The system 10 may include multiple semiconductor devices. For example, in addition to the processor 12 and the memory 26, the system 10 may also include an image sensor or imager 28 coupled to the processor 12 to provide digital imaging functionality. The imager 28 may include a charge coupled device (CCD) sensor or a complementary metal oxide semiconductor (CMOS) sensor having an array of photoreceptors or pixel cells configured to be impacted by photons and to convert such impact into electrical current via the photoelectric effect. While the imager 28 may be coupled remotely from the processor 12, such as by way of a circuit board, the imager 28 and processor 12 may instead be integrally formed, such as on a common substrate.

Figure 2:
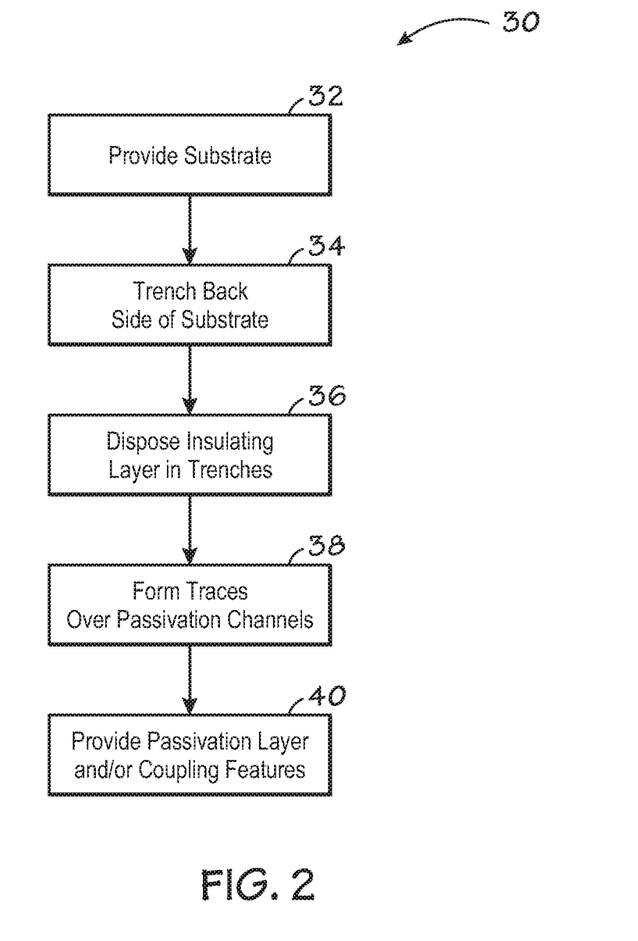
FIG. 2 is a flow diagram of a method related to the manufacture of a device in accordance with one embodiment of the present invention.

A method 30 for manufacturing a semiconductor device, such as the processor 12, the memory 26 and/or the imager 28, is generally provided in FIG. 2 in accordance with one embodiment of the present invention. Particularly, the method 30 includes a number of steps 32-40, which are described in greater detail below with respect to FIGS. 3-13. For instance, the method 30 includes a step 32 of providing a substrate and a step 34 of forming trenches or recesses in the substrate, as generally discussed herein with respect to FIGS. 3-7. The method 30 also includes a step 36 of disposing an insulating material in the trenches, as generally discussed below with reference to FIGS. 8 and 9. Additionally, the method 30 includes a step 38 of forming traces over the trenches filled with the insulating material, as discussed with respect to FIGS. 10 and 11. Further, the method 30 includes a step 40 of providing a passivation layer and/or coupling features over the traces on the backside of the substrate, as discussed with respect to FIG. 12-13. As will be appreciated, one or more of these steps of the method 30 may be performed in a reactor or processing chamber such that the environment in which the steps are performed may be regulated.

Figure 3:
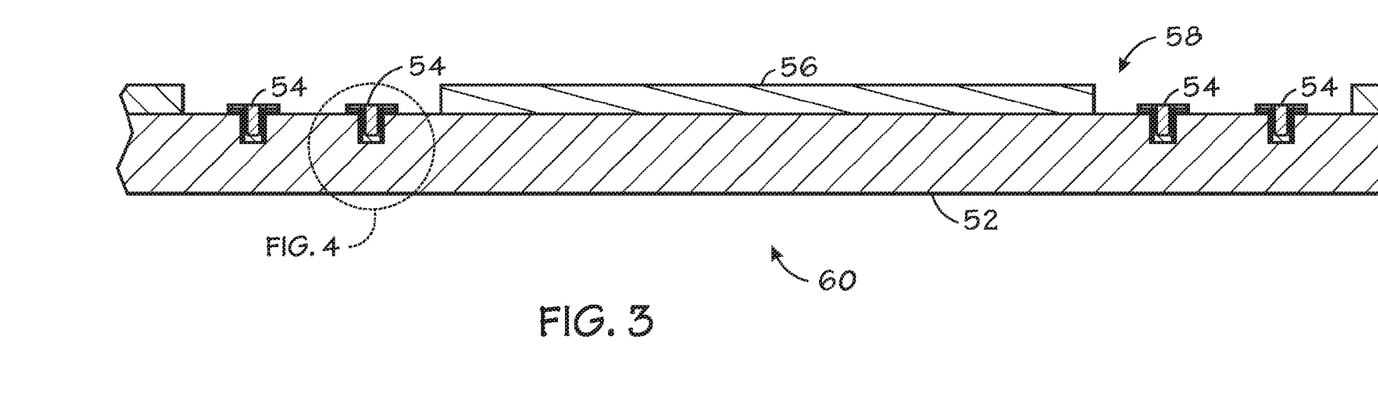
FIG. 3 is a cross-sectional view of a device having, among other things, a via formed in a substrate in accordance with one embodiment of the present invention.
Figure 4:
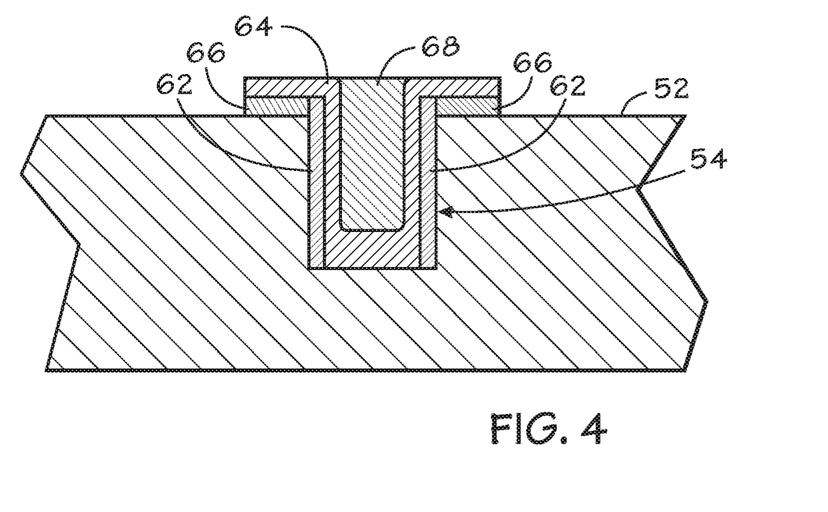
FIG. 4 is a cross-sectional view of a portion of the device of FIG. 3, depicting in greater detail the substrate and via of the device in accordance with one embodiment of the present invention.

Turning now to step 32, a device 50, such as an imager array or processor package, is illustrated in FIGS. 3 and 4 in accordance with one embodiment of the present invention. As illustrated in FIG. 3, the device 50 includes a substrate 52, one or more through-wafer interconnects (TWI) or vias 54, and an integrated circuit die 56. The substrate 52 includes a front side 58 and a backside 60. It should be noted that the front side 58 may be defined as the front side 58 because it is processed before the backside 60. The vias 54 are formed in the front side 58 of the substrate 52 and may be processed in the substrate 52 using any of numerous procedures that are known in the art. For example, the vias 54 may be formed using photoresist in a standard etching procedure. The integrated circuit die 56 is disposed on the front side 58 of the substrate 52 and, depending on the function of the device 50, may include various types of devices (e.g., a memory chip, microprocessor, or management circuit). For the sake of efficiency, the present technique may be implemented as a wafer-level process, in which the substrate 52 is a semiconductor wafer having numerous die regions having various features formed thereon, such as an image sensor or processor, thus facilitating simultaneous mass production of such devices 50. In other embodiments, however, the substrate 52 may be composed of other structures, such as an individual semiconductor die, in accordance with the present technique.

As illustrated in FIG. 4, the via 54 may include a sidewall passivation layer 62 (e.g., a dielectric material), a barrier 64 (e.g., a conductive material), bond pads 66, and a conductive via filling 68. The sidewall passivation layer 62 at least partially isolates the barrier 64 from other portions of the substrate 52. The sidewall passivation layer 62 and/or the barrier 64 may be formed through a pulsed deposition layer process, an atmospheric pressure chemical vapor deposition (APCVD) process, or through any other suitable process. Further, in some embodiments, the barrier 64 may comprise a metal, such as palladium, a copper-nickel alloy, or the like. The barrier 64 is disposed in contact with the bond pads 66 to facilitate electrical communication between the barrier 64 and other features of the substrate 52, such as the integrated circuit 56. Additionally, in one embodiment, the remainder of the via 54 comprises the via filling 68, which may be disposed within the barrier 64. The via filling 68 may include a fill material such as polymer and/or solder.

Figure 5:
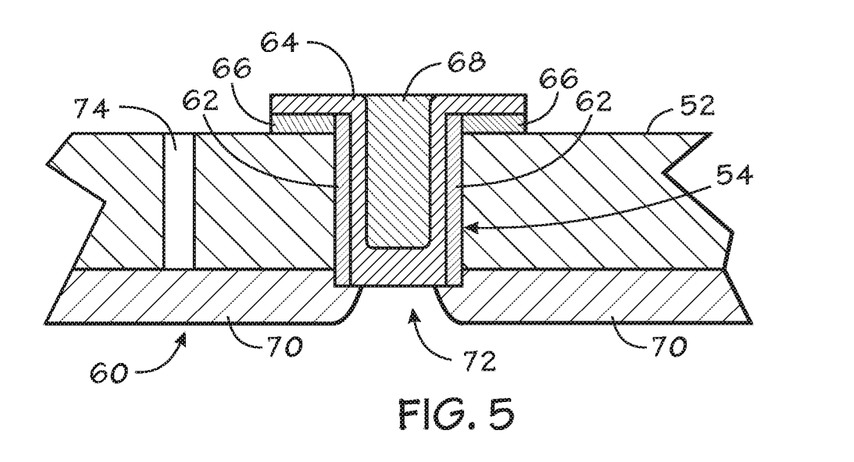
FIG. 5 is a cross-sectional view of the device of FIG. 4 following etching of an alignment mark, thinning of the substrate, and addition of a passivation layer in accordance with one embodiment of the present invention.

After formation of the via 54, the backside 60 of the substrate 52 may be modified to include a backside passivation layer 70 adjacent the via 54, as illustrated in FIG. 5. This modification may include etching or grinding away a portion of the substrate 52 and disposing the backside passivation layer 70 thereon. This backside passivation layer 70 may include the same material utilized in the side wall passivation layer 62 and may be formed through any of various known procedures. The backside passivation layer 70 includes a window 72 that exposes the associated via 54. As will be appreciated, although not shown in FIG. 5, the backside passivation layer 70 may include a number of such windows 72 to expose a plurality of vias 54. The backside passivation layer 70 and the window 72 may be formed through any suitable process. For instance, in one embodiment, the backside passivation layer 70 is spun-on to the substrate 52 and patterned to form the window 72. Further, in one embodiment, patterning the window 72 may include applying a photoresist layer to the passivation layer 70, exposing and developing the photoresist layer, etching the window 72 through the opening in the photoresist layer, stripping the photoresist layer, and so forth. In another embodiment, forming the window 72 may include grinding and/or polishing the backside passivation layer 70 to expose the via 54.

In one embodiment, the step 32 also includes providing backside alignment marks 74 to facilitate inclusion of certain features (e.g., grooves or traces) on the backside 60 of the substrate 52, as further illustrated in FIG. 5. Specifically, the relative positioning of the backside alignment marks 74 with respect to other substrate features (e.g., the vias 54) may be utilized to accurately position features on the backside 60 of the substrate 52. For example, the backside alignment marks 74 may facilitate alignment and exposure of photoresist on the backside 60 of the substrate 52 to produce a layer pattern for producing traces that network the vias 54 to other areas of the substrate 52. The backside alignment marks 74 may include holes with a specific cross-section shape (e.g., a star or cross) that are etched into the substrate 52 to the same depth as the vias 54, as illustrated in FIG. 5. The shape of the holes forming the backside alignment marks 74 may make them readily discernible from other substrate features. In other embodiments, the backside alignment marks 74 may include laser marks. In yet other embodiments, different alignment procedures may be utilized instead of including the backside alignment marks 74. For example, a front-to-back looking stepper, illumination with infrared light, patterning, and the like may be utilized to properly align the substrate 52 in preparation for deposits on the substrate 52, etching of the substrate 52, and so forth.

Figure 6:
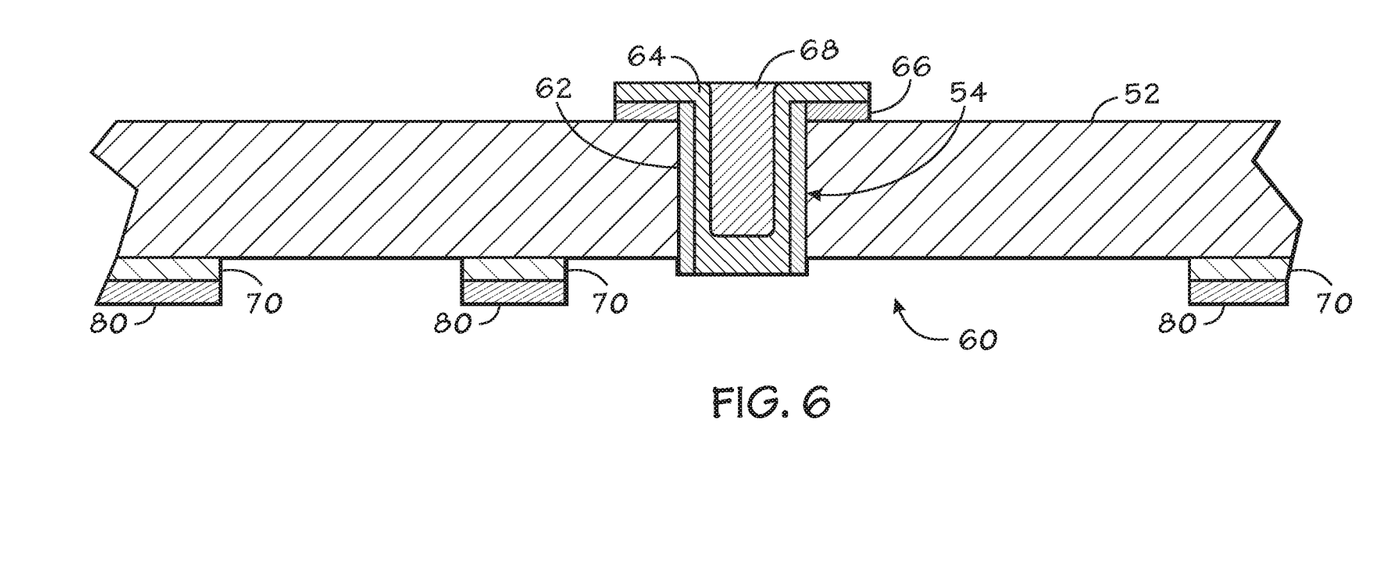
FIG. 6 is cross-sectional view of the device of FIG. 5, illustrating the removal of portions of the passivation layer in accordance with one embodiment of the present invention.

Turning now to the step 34 of the method 30, formation of a backside redistribution layer on the substrate 52 may begin with forming trenches in the substrate. This process of trenching the substrate 52 may include first removing portions of the backside passivation layer 70. As illustrated in FIG. 6, the lower surface or backside 60 of the device 50 may be coated with photoresist 80, which may be exposed and developed in a pattern such that portions of the backside passivation layer 70 remain uncovered for etching. In the embodiment illustrated by FIG. 6, select portions of the backside passivation layer 70 have been etched away and the photoresist 80 remains on the protected portions of the backside passivation layer 70. The etched areas of the passivation layer 70 reveal or expose portions of the substrate 52 for etching. It should be noted that some embodiments do not include the backside passivation layer 70.

Figure 7:
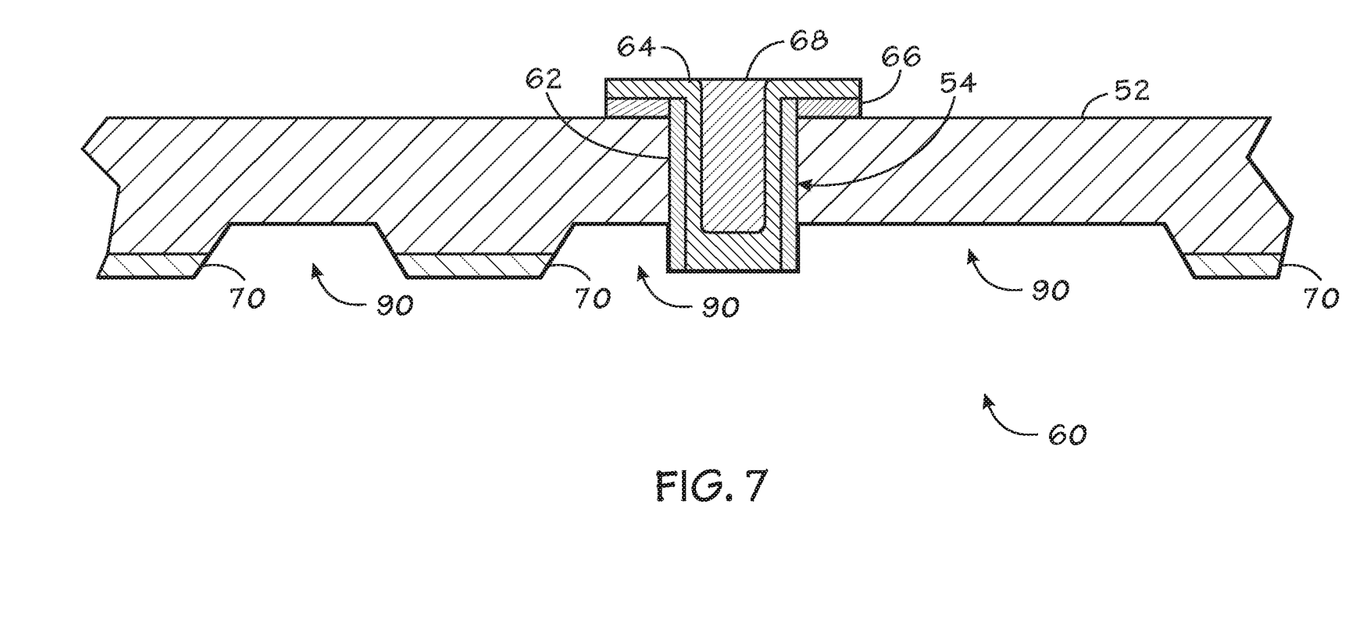
FIG. 7 is a cross-sectional view illustrating trenches formed in the backside of the device of FIG. 6 in accordance with one embodiment of the present invention.

As illustrated in FIG. 7, the exposed areas of the substrate 52 may be removed (e.g., via wet or dry etching processes) to create trenches 90 in the backside 60 of the substrate 52. In some embodiments, the same photoresist 80 used to etch the backside passivation layer 70 may be utilized to etch the trenches 90 into the substrate 52. However, if the chemicals utilized for etching the substrate 52 are incompatible with the photoresist 80, the photoresist 80 may be removed. Indeed, depending on the procedure for forming the trenches 90, the photoresist 80 may be replaced by a different photoresist or the remaining portions of the backside passivation layer (e.g., glass) 70 may serve to define the size and shape of the trenches 90 for an etching procedure. In one embodiment, wherein the substrate 52 is made of silicon, the trenches 90 may be etched into the substrate 52 with a chemical that is highly selective to silicon (e.g., RIE SFG Plasma, wet KOH or TMAH). For example, in one embodiment, $NH_4OH$ is used to selectively etch the silicon substrate 52 to create the trenches 90. As may be appreciated, however, other materials and/or processes may also or instead be used to thin the substrate 52 and/or create the trenches 90 in the substrate 52.

Figure 8:
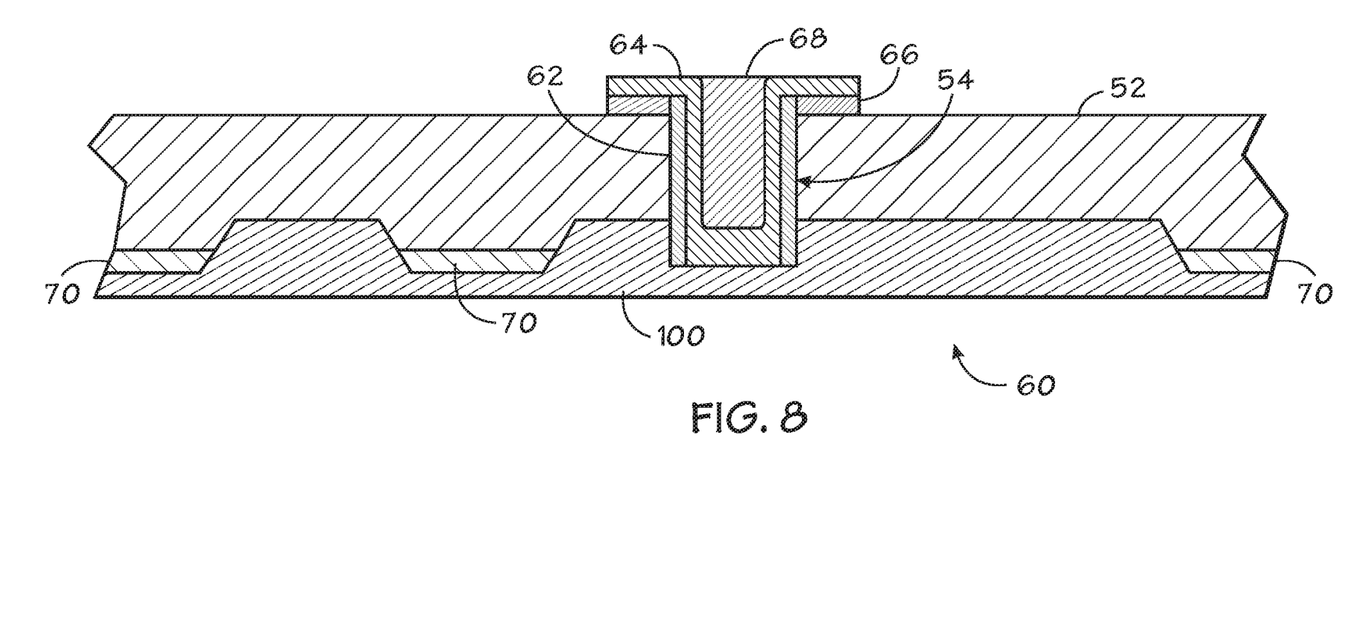
FIG. 8 is a cross-sectional view depicting an insulation layer disposed in the trenches and along the backside of the device of FIG. 7 in accordance with one embodiment of the present invention.
Figure 9:
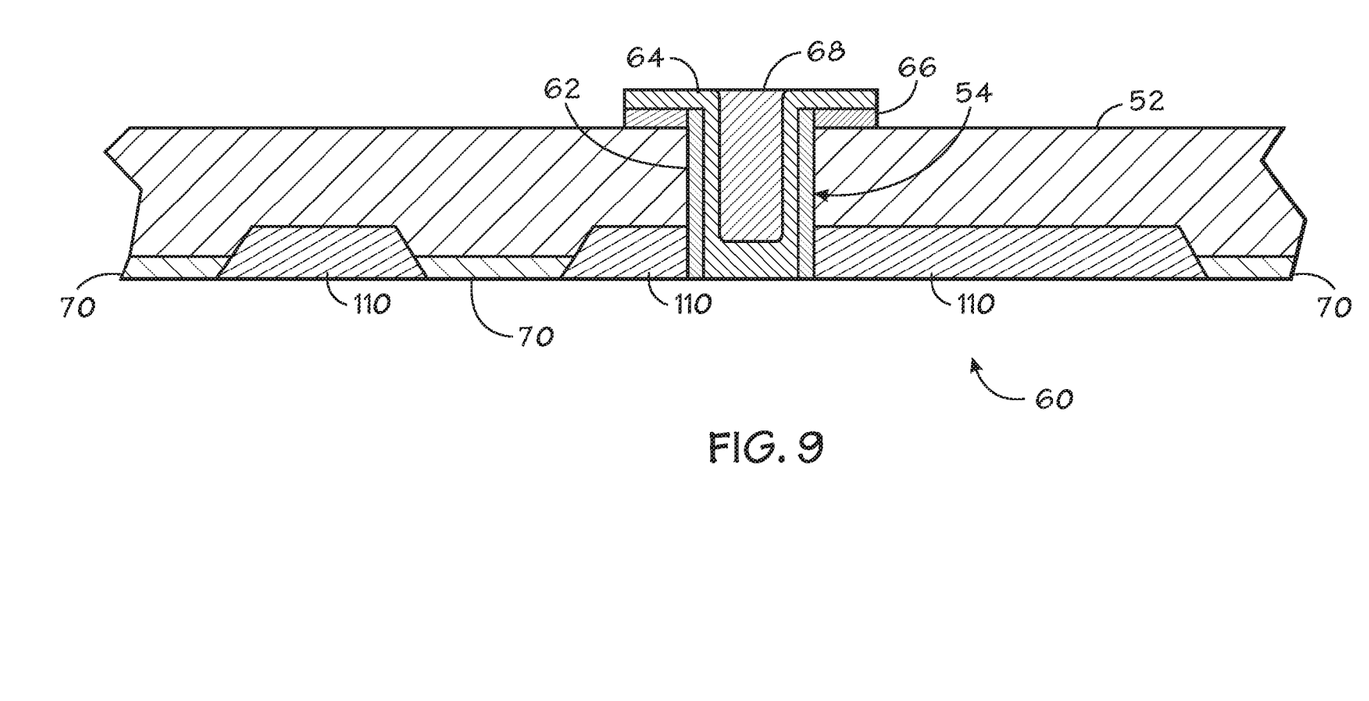
FIG. 9 is a cross-sectional view illustrating the device of FIG. 8 wherein portions of the insulation layer outside of the trenches have been removed in accordance with one embodiment of the present invention.

Turning now to the step 36, in accordance with present embodiments, once the trenches 90 are formed, an insulating layer 100 may be disposed on the backside 60 of the substrate 52, as illustrated in FIG. 8. The insulating layer 100 fills the trenches 90 and coats the backside 60 of the substrate 52. The insulating layer 100 may be formed from an insulating polymer (e.g., PBO) and may be applied via any number of known procedures. For example, the insulating layer 100 may be applied via spin coating, 3D write, screen printing, dispensing, and so forth. Once the insulating layer 100 has been disposed over the backside 60 of the substrate 52 and in the trenches 90, it may be ground and planarized using chemical and/or mechanical planarization such that substantially all of the insulating layer 100 is removed except for that portion filling the trenches 90, as illustrated in FIG. 9.

Figure 10:
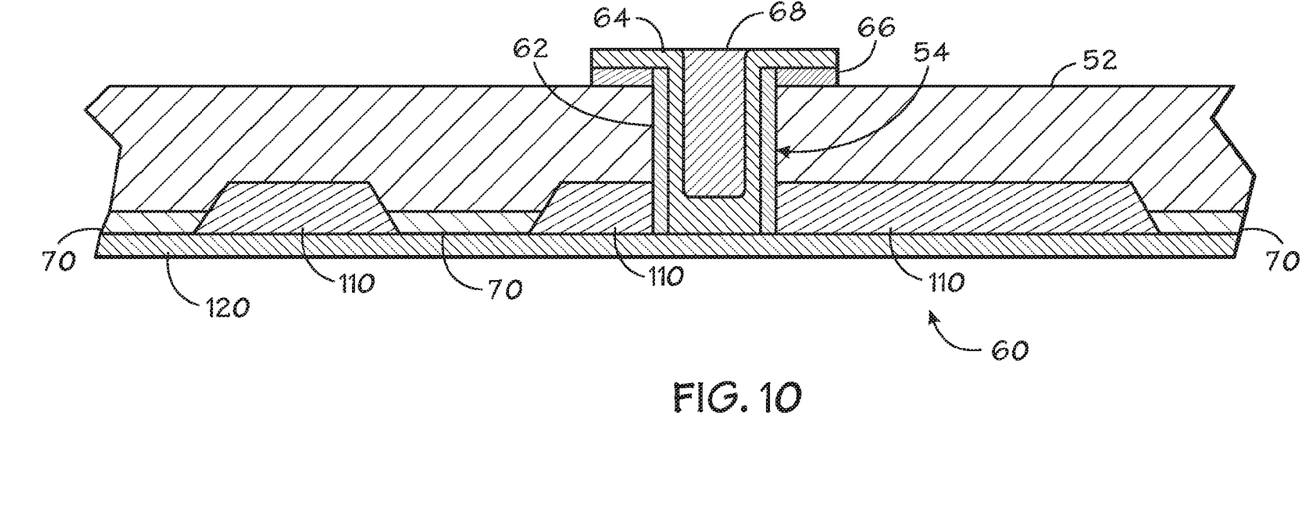
FIG. 10 is a cross-sectional view generally illustrating the addition of one or more metal layers to the device of FIG. 9 in accordance with one embodiment of the present invention.

The remaining portions of the insulating layer 100 that fill the trenches 90 may be referred to as passivation channels 110. Once the passivation channels 110 have been established, the step 38 of the method 30 may be initiated wherein conductive traces are disposed over the passivation channels. The traces may be disposed over the passivation channels using various known methods. In one embodiment, as illustrated in FIG. 10, the step 38 may include disposing a redistribution metal (e.g., metal) over the backside 60 of the substrate 52 to form a conductive layer 120. For example, this may include applying the redistribution metal over the backside 60 of the substrate 52 via sputtering, an atmospheric pressure chemical vapor deposition (APCVD) process, or other similar processes.

Figure 11:
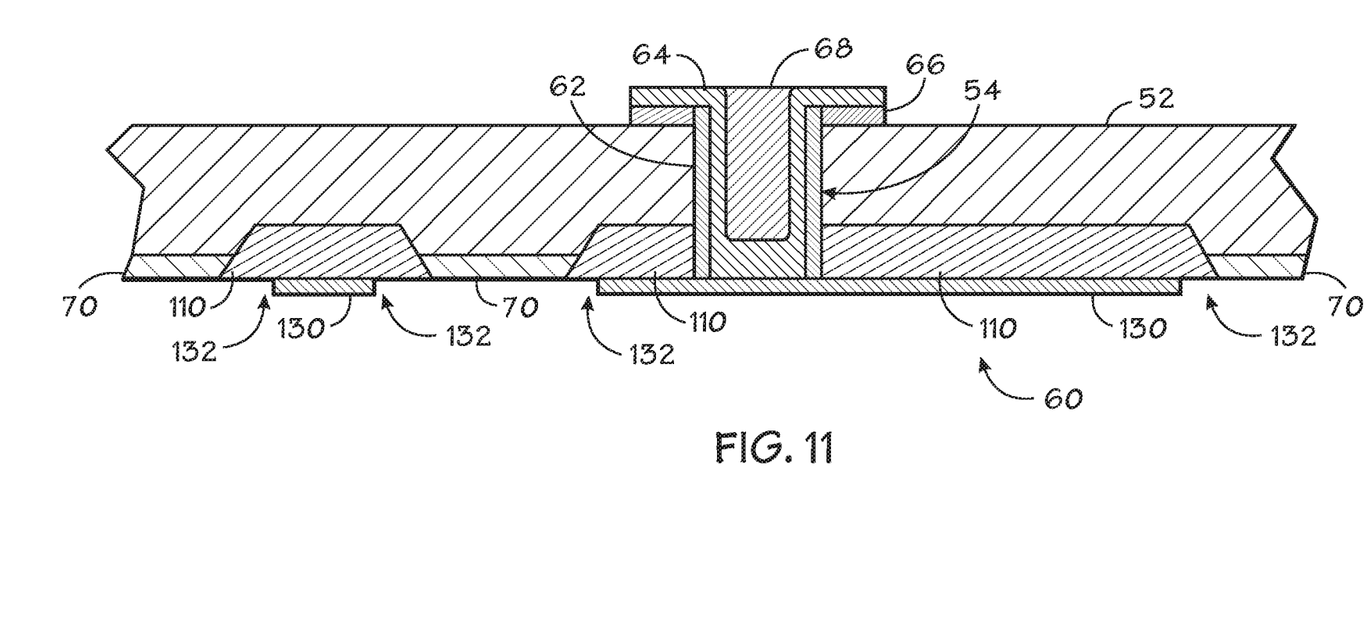
FIG. 11 is a cross-sectional view generally illustrating traces formed from the metal layers disposed on the device in FIG. 10 in accordance with one embodiment of the present invention.

The conductive layer 120 may be patterned through various steps, such as resist and etch steps, to produce a desired configuration. Specifically, the conductive layer 120 may be selectively removed to establish traces 130 that are disposed over the passivation channels 110, as illustrated in FIG. 11. In some embodiments, a photoresist may be utilized in an etching process to define the size and location of the traces 130. For instance, in some embodiments, a photoresist layer may be disposed over the conductive layer 120 and developed to expose certain portions of the conductive layer 120, which may then be removed via wet and/or dry etch processes. In one embodiment, the exposed portions of the conductive layer 120 may be etched through a wet etch process that utilizes $HNO_3$, HF, and $H_2O$. In some embodiments, the process utilized for forming the traces 130 may establish a buffer zone 132 between the edges of the passivation channels 110 and the edges of the traces 130, as shown in FIG. 11, to provide an additional protective measure. Further, one or more of the traces 130 may directly contact the via 54.

It should be noted that, in some embodiments, the conductive layer 120 may be composed of different materials and/or a different number of layers or sub-layers. Indeed, the conductive layer 120 may be composed of a single layer of conductive material or a plurality of sub-layers. For instance, the conductive layer 120 may comprise one or more layers of copper, tantalum-nitride, aluminum, titanium, or the like. Each layer may be separately applied and etched into a desired pattern to form the traces 130, as described above.

Arranging the traces 130 over the passivation channels 110 may prevent the traces 130 from directly contacting the substrate 52. In other words, the passivation channels 110 may insulate the conductive material of the traces 130 from the material (e.g., silicon) forming the substrate 52. Accordingly, the passivation channels 110 may prevent current leakage and so forth in a device employing these features. In traditional front side applications, these functions served by the passivation channels 110 may be served by simply applying a passivation layer of a relatively high expansion polymer (e.g., PBO) onto the front side 58 without limiting it to defined areas, such as the passivation channels 110. While this may be a functional approach, especially for front side applications, it is now recognized that such a procedure may not be desirable for backside applications.

Due to high curing temperatures and high expansion of the material utilized in traditional front side applications to form the insulating passivation layer, stress may be placed on the substrate 52 as a result of the formation of the insulating passivation layer. This is generally not an issue with front side applications because, in front side applications, the substrate is generally thick enough to resist warping due to the stresses. However, because the substrate is generally thinner in backside applications than in front side applications, backside applications are more susceptible than front side applications to warping from the pressure exerted by an entire layer of the insulating material. In view of these issues, among others, present embodiments reduce or substantially eliminate the stresses that cause warping by limiting the insulating material to the areas defined by the trenches 90. In other words, once the insulating layer 100 is applied, the portion outside of the passivation channels 90 is substantially removed. Further, present embodiments may limit the stress associated with the insulating material by utilizing a low expansion polymer, such as HD Microsystems 2611, instead of high expansion polymers. It should be noted that the substrate 52 may be supported during the deposition of the insulating layer 100 on the backside 60 of the substrate 52 and, thus, the associated stresses are not an issue during that portion of the process.

Figure 12:
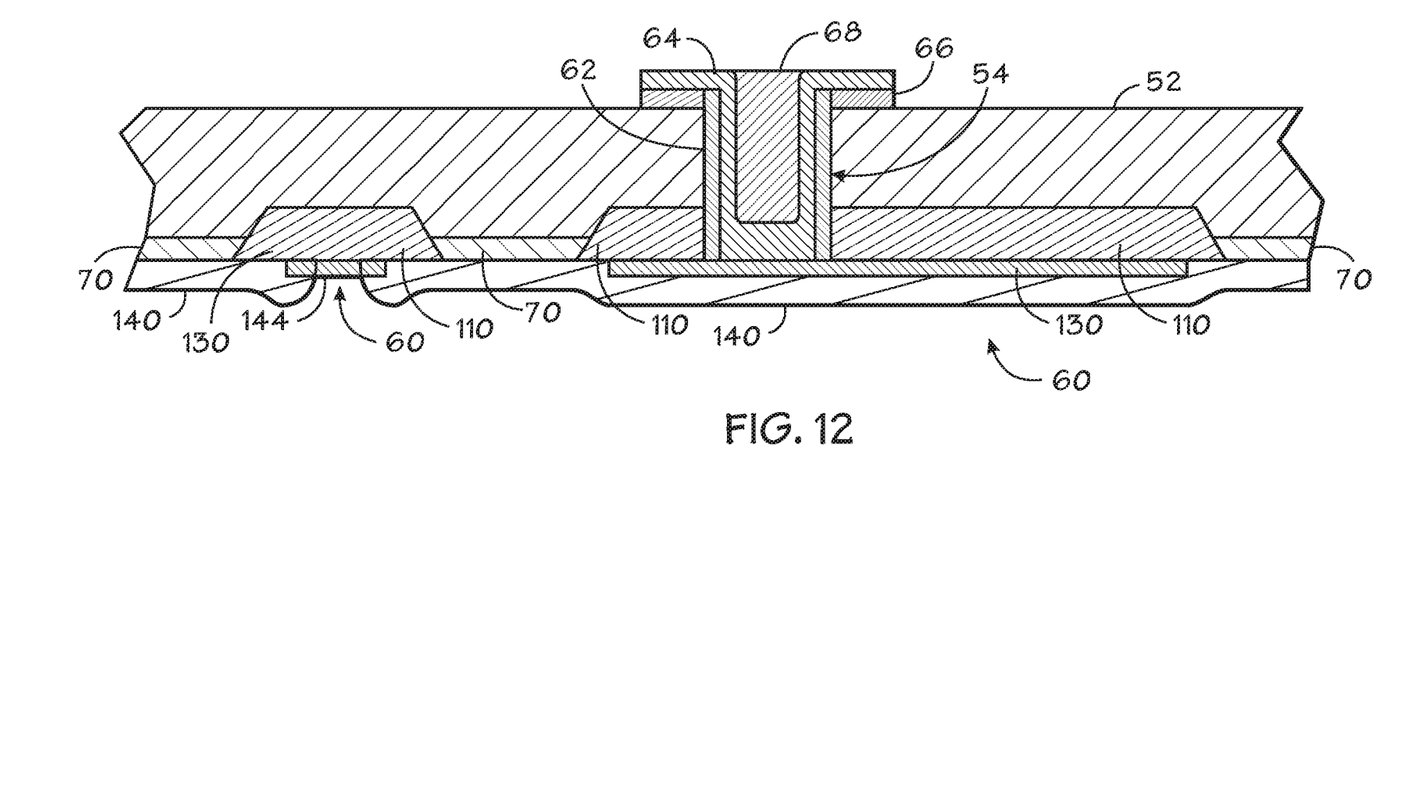
FIG. 12 is a cross-sectional view depicting an additional passivation layer formed on the device of FIG. 11 in accordance with one embodiment of the present invention.

Following the patterning of the conductive layer 120 to provide the traces 130 over the passivation channels 110, a passivation layer 140 may be generally disposed over the backside 60 of the substrate 52, including all of the features residing thereon, as provided in FIG. 12. The passivation layer 140 may include a window 142 that exposes a surface 144 of the traces 130. Further, the passivation layer 140 and the window 142 may be formed through any suitable processes, including those discussed above with respect to the passivation layer 70. Thus, a redistribution layer formed through the step 40 of the method 30 generally includes the traces 130 formed from the conductive layer 120, the passivation layers 70 and 140, and the passivation channels 110. While the redistribution layer of some embodiments may include additional elements or layers, the redistribution layer 140 of other embodiments consist of, or consist essentially of, the traces 130, the passivation layers 70 and 140, and the passivation channels 110.

Figure 13:
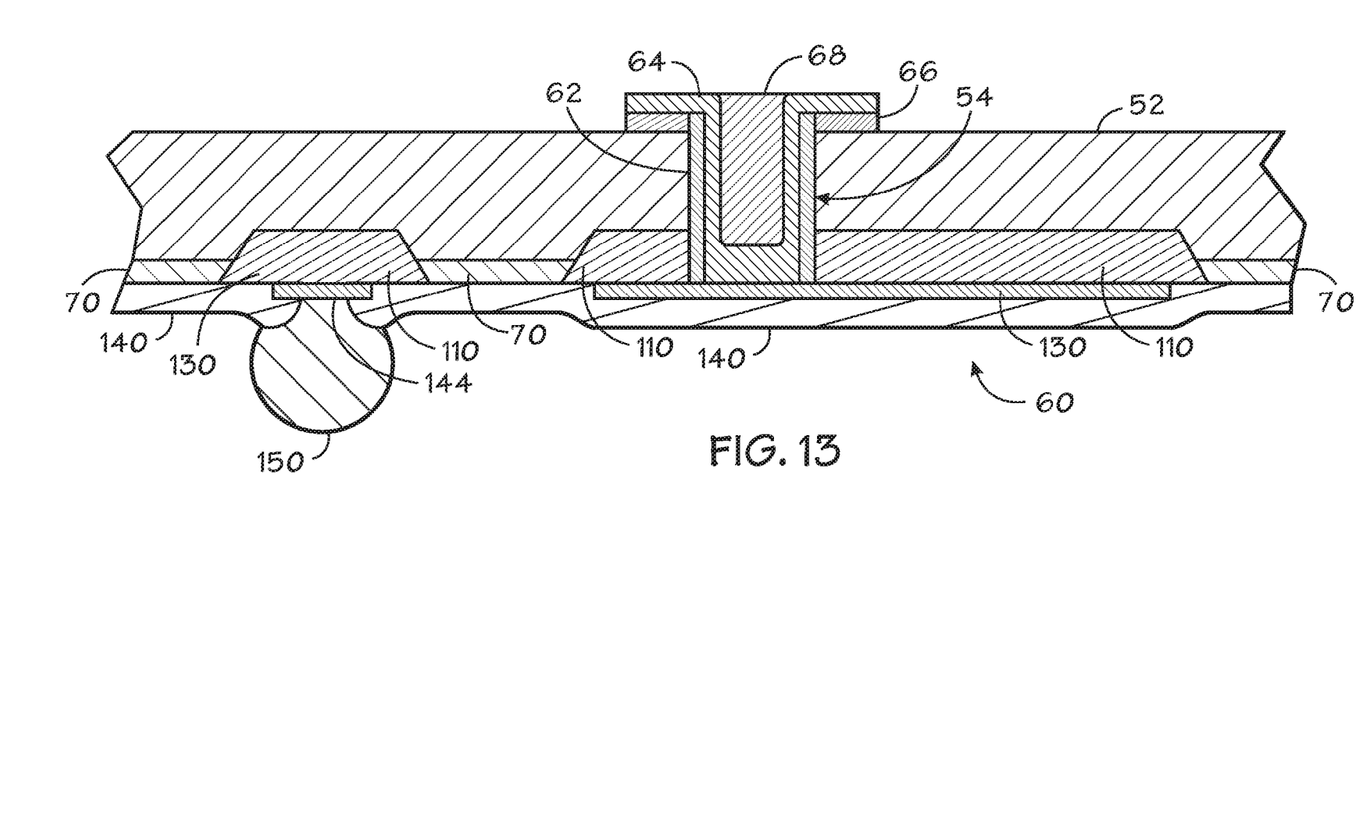
FIG. 13 is a partial cross-sectional view depicting the formation of under-bump-metallurgy (UBM) features on the device of FIG. 12 in accordance with one embodiment of the present invention.

Finally, with respect to step 40 of the method 30, various under-bump-metallurgy (UBM) features may be formed on the device 50, as generally illustrated in FIG. 13. In the presently illustrated embodiment, the exposed surface 144 of the conductive trace 130 directly couples with a contact bump 150. In other embodiments, the trace 130 may be plated (e.g., via an electroless deposition process or an immersion plating process) with one or more materials (e.g., nickel or gold) before receiving the contact bump 150. Following any desired plating, the contact bump 150 may be coupled to the surface 144, either directly or via the one or more plating layers. The contact bump 150 may be formed of any suitable, electrically-conductive material, such as solder. Notably, the contact bump 150 facilitates direct coupling of the device 50 to other circuitry. In some embodiments, the provision of contact bumps 150 may allow for the direct coupling of the substrate 52 to a circuit board without requiring additional, intervening substrates or wire bonding. For instance, in one embodiment, the contact bump 150 may enable the device 50 to be directly received in a socket of a circuit board, allowing electrical communication between features of the substrate 52, such as an image sensor or imager, and various circuitry and features external to the device 50.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A semiconductor system, comprising:
   a substrate comprising a first side and a second side, wherein the second side comprises a front side of the substrate and includes an integrated circuit disposed thereon;
   a trench formed in the first side of the substrate;
   a passivation channel of insulating material filling the trench such that the insulating material does not extend over an outer surface of the first side of the substrate; and
   a conductive trace positioned on the passivation channel such that the conductive trace does not directly contact the substrate.

2. The system of claim 1, wherein the insulating material comprises a low expansion polymer.

3. The system of claim 1, comprising a via extending through the substrate from the first side to the second side.

4. The system of claim 1, wherein the substrate comprises a semiconductor wafer including a plurality of die regions.

5. The system of claim 1, comprising a processor, an image sensor, or imager.

6. A semiconductor system, comprising:
   a substrate comprising a first side and a second side;
   a trench formed in the first side of the substrate;
   a passivation channel of insulating material filling the trench such that the insulating material does not extend over an outer surface of the first side of the substrate;
   a conductive trace positioned on the passivation channel such that the conductive trace does not directly contact the substrate; and
   a passivation layer disposed over the first side, wherein the passivation layer comprises a window that exposes at least a portion of the conductive trace through the passivation layer.

7. A semiconductor system, comprising:
   a substrate comprising a first side and a second side;
   a trench formed in the first side of the substrate;
   a passivation channel of insulating material filling the trench such that the insulating material does not extend over an outer surface of the first side of the substrate;
   a conductive trace positioned on the passivation channel such that the conductive trace does not directly contact the substrate; and
   a contact bump communicatively coupled with the conductive trace.

8. A semiconductor system, comprising:
   a substrate comprising a first side and a second side;
   a trench formed in the first side of the substrate;
   a passivation channel of insulating material filling the trench such that the insulating material does not extend over an outer surface of the first side of the substrate;
   a conductive trace positioned on the passivation channel such that the conductive trace does not directly contact the substrate, wherein the conductive trace is positioned on the passivation channel such that a buffer zone is established between an edge of the conductive trace and an edge of the passivation channel.

9. A method of forming a semiconductor system, comprising:
   forming a trench in a back side of a substrate of the semiconductor system that is opposite a front side of the substrate;
   forming a passivation channel of insulating material that fills the trench without extending over an outer surface of the back side of the substrate; and
   forming a conductive trace on the passivation channel such that the conductive trace does not directly contact the substrate.

10. The method of claim 9, comprising attaching an integrated circuit to the front side of the substrate prior to forming the trench in the back side of the substrate.

11. The method of claim 9, wherein forming the passivation channel comprises disposing an insulating layer over the back side of the substrate including the trench, and then removing a portion of the insulating layer that is not within the trench.

12. The method of claim 9, wherein forming the conductive trace comprises disposing a conductive layer over the back side of the substrate including the passivation channel and then selectively removing portions of the conductive layer to leave the conductive trace.

13. The method of claim 9, comprising forming a via through the front side to the back side of the substrate.

14. The method of claim 13, comprising positioning the passivation channel and conductive trace such that the conductive trace communicatively interacts with the via.

15. The method of claim 9, comprising disposing a passivation layer over the conductive trace.

16. The method of claim 15, comprising exposing a portion of the conductive trace through the passivation layer.

17. A redistribution layer of a semiconductor device, consisting essentially of:
   a plurality of passivation channels each comprising an insulating material filling a trench formed in a first side of a substrate of the semiconductor device such that the insulating material does not extend beyond the trench onto the first side, wherein the first side is opposite a second side of the substrate;
   a plurality of conductive traces respectively disposed on the plurality of passivation channels such that the conductive traces do not directly contact the substrate; and
   a passivation layer disposed over a portion of the first side of the substrate.

18. The redistribution layer of claim 17, wherein the passivation layer is in direct contact with the first side of the substrate and the passivation channels.

19. The redistribution layer of the semiconductor device of claim 17, comprising an additional passivation layer disposed over the passivation layer and at least a portion of the plurality of conductive traces.

* * * * *